(12) United States Patent
Zhang

(10) Patent No.: US 9,362,905 B2
(45) Date of Patent: Jun. 7, 2016

(54) COMPOSITE SEMICONDUCTOR DEVICE WITH TURN-ON PREVENTION CONTROL

(75) Inventor: Jason Zhang, Monterey Park, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 96 days.

(21) Appl. No.: 13/415,779

(22) Filed: Mar. 8, 2012

(65) Prior Publication Data

US 2012/0241819 A1    Sep. 27, 2012

Related U.S. Application Data

(60) Provisional application No. 61/454,743, filed on Mar. 21, 2011.

(51) Int. Cl.
| | |
|---|---|
| H01L 29/30 | (2006.01) |
| H03K 17/30 | (2006.01) |
| H03K 17/10 | (2006.01) |
| H03K 17/16 | (2006.01) |
| H03K 17/567 | (2006.01) |

(52) U.S. Cl.
CPC ............... *H03K 17/30* (2013.01); *H03K 17/107* (2013.01); *H03K 17/168* (2013.01); *H03K 17/567* (2013.01)

(58) Field of Classification Search
USPC ................... 257/195, 392, E27.061, E29.246
See application file for complete search history.

(56) References Cited

U.S. PATENT DOCUMENTS

| | | | |
|---|---|---|---|
| 4,663,547 A | 5/1987 | Baliga | |
| 5,142,239 A | 8/1992 | Brayton | |
| 5,939,753 A * | 8/1999 | Ma et al. | 257/339 |
| 6,316,809 B1 | 11/2001 | Eshraghi | |
| 7,291,872 B2 * | 11/2007 | Hikita et al. | 257/192 |
| 7,501,670 B2 * | 3/2009 | Murphy | 257/194 |
| 7,719,055 B1 * | 5/2010 | McNutt et al. | 257/341 |
| 7,777,254 B2 * | 8/2010 | Sato | 257/194 |
| 7,915,645 B2 | 3/2011 | Briere | |
| 8,084,783 B2 * | 12/2011 | Zhang | 257/133 |
| 8,368,120 B2 * | 2/2013 | Lidow et al. | 257/194 |

(Continued)

FOREIGN PATENT DOCUMENTS

| | | |
|---|---|---|
| EP | 2 242 103 | 10/2010 |
| JP | 3-196572 | 8/1991 |

(Continued)

OTHER PUBLICATIONS

Ashot Melkonyan, "High Efficiency Power Supply using new SiC devices", 2007, Kassel University Press GmbH, pp. 1-3, 105-106.

(Continued)

*Primary Examiner* — Jaehwan Oh
(74) *Attorney, Agent, or Firm* — Farjami & Farjami LLP

(57) ABSTRACT

There are disclosed herein various implementations of composite III-nitride semiconductor devices having turn-on prevention control. In one exemplary implementation, a normally OFF composite semiconductor device comprises a normally ON III-nitride power transistor and a low voltage (LV) device cascoded with the normally ON III-nitride power transistor to form the normally OFF composite semiconductor device. The LV device is configured to have a noise-resistant threshold voltage to provide the turn-on prevention control for the normally OFF composite semiconductor device by preventing noise current from flowing through a channel of the normally ON III-nitride power transistor in a noisy system.

13 Claims, 4 Drawing Sheets

(56) References Cited

U.S. PATENT DOCUMENTS

| | | |
|---|---|---|
| 8,766,375 B2 | 7/2014 | Bramian |
| 2001/0024138 A1 | 9/2001 | Dohnke |
| 2002/0153938 A1 | 10/2002 | Baudelot |
| 2003/0011436 A1 | 1/2003 | Shigematsu |
| 2003/0137037 A1 | 7/2003 | Omura |
| 2004/0184216 A1 | 9/2004 | Kurosawa |
| 2005/0007200 A1 | 1/2005 | Inoue |
| 2006/0060895 A1* | 3/2006 | Hikita et al. ............... 257/280 |
| 2006/0113593 A1* | 6/2006 | Sankin et al. ............... 257/341 |
| 2006/0175627 A1* | 8/2006 | Shiraishi ..................... 257/99 |
| 2007/0046379 A1 | 3/2007 | Tanahashi |
| 2007/0170897 A1 | 7/2007 | Williams |
| 2007/0210333 A1 | 9/2007 | Lidow |
| 2007/0215899 A1* | 9/2007 | Herman ..................... 257/147 |
| 2007/0228401 A1* | 10/2007 | Machida et al. ............. 257/96 |
| 2008/0191216 A1* | 8/2008 | Machida et al. ............. 257/76 |
| 2008/0230784 A1* | 9/2008 | Murphy ....................... 257/76 |
| 2009/0135636 A1* | 5/2009 | Kuzumaki et al. .......... 363/132 |
| 2010/0117095 A1* | 5/2010 | Zhang ......................... 257/76 |
| 2010/0224885 A1* | 9/2010 | Onose .......................... 257/77 |
| 2010/0301396 A1 | 12/2010 | Briere |
| 2011/0018625 A1* | 1/2011 | Hodel et al. ................ 327/581 |
| 2011/0140169 A1 | 6/2011 | Briere |
| 2011/0169550 A1 | 7/2011 | Brindle |
| 2011/0210337 A1* | 9/2011 | Briere ........................ 257/76 |
| 2011/0210338 A1 | 9/2011 | Briere |
| 2012/0105131 A1 | 5/2012 | Biela |
| 2013/0062671 A1* | 3/2013 | Saito et al. .................. 257/288 |

FOREIGN PATENT DOCUMENTS

| | | |
|---|---|---|
| JP | H3-196572 | 8/1991 |
| JP | 8-308092 | 11/1996 |
| JP | 2006-351691 | 12/2006 |
| JP | 2008-243943 | 10/2008 |
| JP | 2009-38130 | 2/2009 |
| JP | 2010-94006 | 4/2010 |
| JP | 2010-522432 | 7/2010 |
| JP | 2010-278280 | 12/2010 |
| JP | 2010-283346 | 12/2010 |
| JP | 2011-29386 | 2/2011 |
| WO | WO 2008/116038 | 9/2008 |

OTHER PUBLICATIONS

U.S. Appl. No. 61/448,617, filed Mar. 2, 2011, Lin.
U.S. Appl. No. 61/448,347, filed Mar. 2, 2011, Lin.
U.S. Appl. No. 61/339,190, filed Mar. 1, 2010, Briere.
U.S. Appl. No. 61/454,081, filed Mar. 18, 2011, Briere.
U.S. Appl. No. 61/454,743, filed Mar. 21, 2011, Zhang.
U.S. Appl. No. 13/416,252, filed Mar. 9, 2012, Zhang.
U.S. Appl. No. 13/419,820, filed Mar. 14, 2012, Briere.
U.S. Appl. No. 13/417,143, filed Mar. 9, 2012, Bramian.
U.S. Appl. No. 14/318,458, filed Jun. 27, 2014, Bramian.

* cited by examiner

COMPOSITE SEMICONDUCTOR DEVICE WITH TURN-ON PREVENTION CONTROL

The present application claims the benefit of and priority to a provisional application entitled "III-Nitride Optimized Rugged Cascode Power Device," Ser. No. 61/454,743 filed on Mar. 21, 2011. The disclosure in this pending provisional application is hereby incorporated fully by reference into the present application.

BACKGROUND

I. Definitions

As used herein, the phrase "III-nitride" or "III-N" refers to a compound semiconductor that includes nitrogen and at least one group III element including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-nitride also refers generally to any polarity including but not limited to Ga-polar, N-polar, semi-polar or non-polar crystal orientations. A III-nitride material may also include either the Wurtzitic, Zincblende or mixed polytypes, and may include single-crystal, monocrystalline, polycrystalline, or amorphous structures.

Also, as used herein, the terms "LV-device," "low voltage semiconductor device," "low voltage transistor," and the like, refer to a low voltage device, with a typical voltage range of up to approximately 50 volts. Typical voltage ratings include low voltage (LV) ~0-50V, midvoltage (MV) ~50-200V, high voltage (HV) ~200-1200V and ultra high voltage (UHV)~>1200V. The device can comprise any suitable semiconductor material that forms a field-effect transistor (FET) or diode, or a combination of a FET and a diode. Suitable semiconductor materials include group IV semiconductor materials such as silicon, strained silicon, SiGe, SiC, and group III-V materials including III-As, III-P, III-nitride or any of their alloys.

II. Background Art

III-nitride materials are semiconductor compounds that have relatively wide direct bandgaps and can have strong piezoelectric polarizations, and can enable high breakdown fields, high saturation velocities, and the creation of two-dimensional electron gases (2-DEGs). As a result, III-nitride materials are used in many power applications such as depletion mode (e.g., normally ON) power field-effect transistors (FETs), high electron mobility transistors (HEMTs), and diodes.

In power management applications where normally OFF characteristics of power devices are desirable, a depletion mode III-nitride device can be cascoded with a low voltage (LV) semiconductor device to produce an enhancement mode composite power device. However, the utility and reliability of such a composite semiconductor device can be limited according to the characteristics of the LV semiconductor device included therein. For example, when implemented in a noisy system environment, the LV device may be inadvertently triggered ON by system noise, causing the composite semiconductor device to be undesirably turned ON as well.

SUMMARY

The present disclosure is directed to a composite semiconductor device with turn-on prevention control, substantially as shown in and/or described in connection with at least one of the figures, and as set forth more completely in the claims.

DETAILED DESCRIPTION

Figure 1:
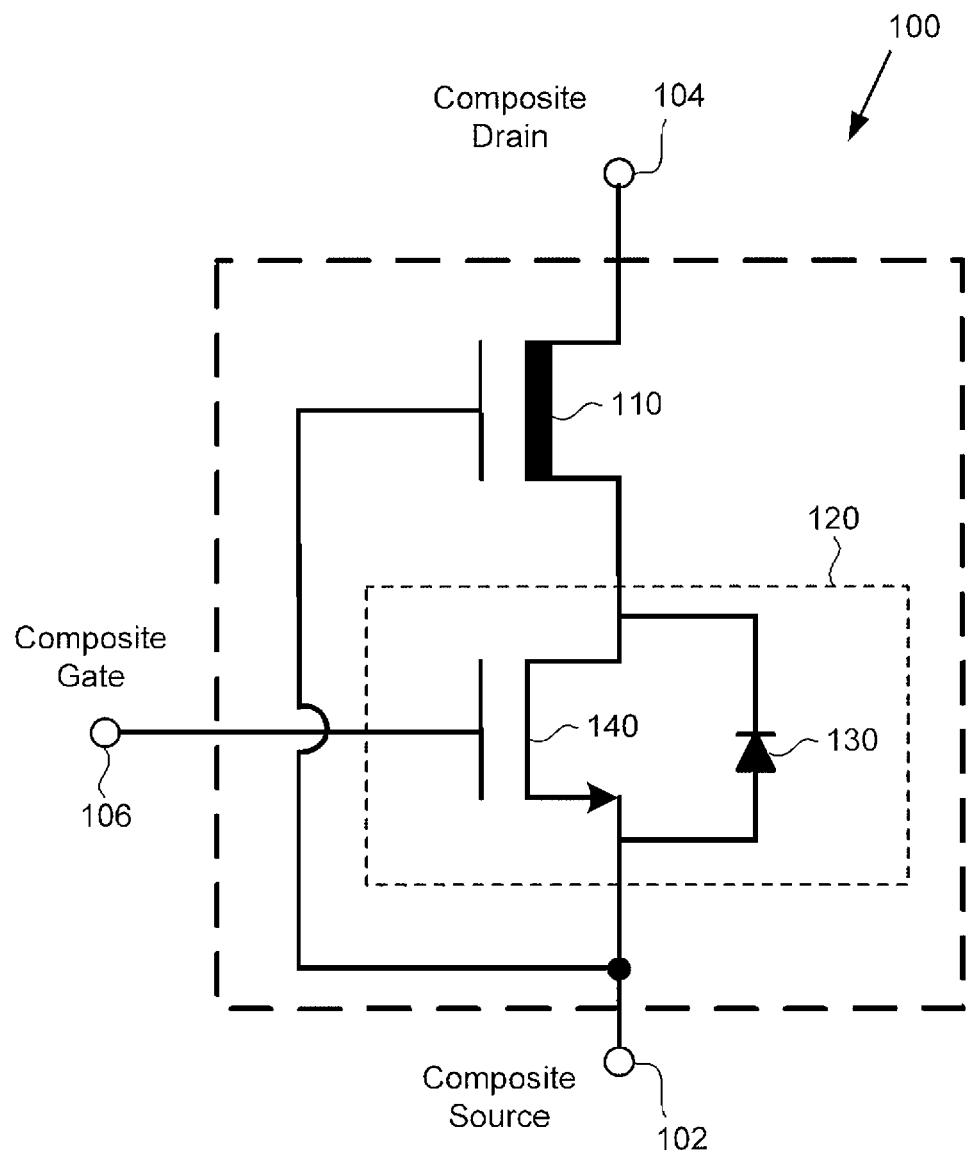
FIG. 1 presents a diagram showing one exemplary implementation of a composite semiconductor device.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

III-nitride materials include, for example, gallium nitride (GaN) and its alloys such as aluminum gallium nitride (AlGaN), indium gallium nitride (InGaN), and aluminum indium gallium nitride (AlInGaN). These materials are semiconductor compounds that have relatively wide direct bandgap and can have strong piezoelectric polarizations, and can enable high breakdown fields, high saturation velocities, and the creation of two-dimensional electron gases (2-DEGs). As a result, and as noted above, III-nitride materials such as GaN are used in many microelectronic applications such as depletion mode (e.g., normally ON) power field-effect transistors (FETs), high electron mobility transistors (HEMTs), and diodes.

As further noted above, in power management applications where normally OFF characteristics of power devices are required, a depletion mode III-nitride device can be cascoded with a low voltage (LV) semiconductor device to produce an enhancement mode composite power device. However, the utility and reliability of such a composite device can be limited according to the characteristics of the LV semiconductor device cascoded with the normally ON III-nitride power device. For example, the composite semiconductor device may be undesirably turned ON due to inadvertent triggering of the LV device by system noise produced in a noisy implementational environment. In order to render such composite devices suitable for operation in possible noisy system environments, the composite device should be configured to have turn-on prevention control.

The present application is directed to a composite semiconductor device having turn-on prevention control. According to one implementation, the composite semiconductor device may include a III-nitride power transistor (such as a III-nitride field-effect transistor or a III-nitride high electron mobility transistor) and an LV device cascoded with the III-nitride power transistor. The cascoded combination of the LV device with the III-nitride power transistor, which may be a normally ON device, for example, can be implemented to produce a normally OFF composite device. As disclosed herein, the LV device may have a noise-resistant threshold voltage (i.e. a higher threshold voltage) configured to provide turn-on prevention control for the normally OFF composite semiconductor device by preventing noise current from flowing through a channel of the normally ON III-nitride power transistor in the noisy system. According to various implementations of the present disclosure, the noise-resistance threshold voltage ($V_{th}$) may be approximately 1.8 volts or higher, such as, by way of examples and without limitation, approximately 3.0 volts or approximately 4.0 volts.

Referring to FIG. 1, FIG. 1 shows one exemplary implementation of a composite III-nitride semiconductor device. As shown in FIG. 1, composite semiconductor device 100 includes III-nitride power transistor (for example, a III-nitride field-effect transistor or a III-nitride high electron mobility transistor) 110 and LV device 120 cascoded with III-nitride power transistor 110. As further shown in FIG. 1, LV device 120 includes LV transistor 140 and LV diode 130. Also shown in FIG. 1 are composite source 102, composite drain 104, and composite gate 106 of composite semiconductor device 100.

III-nitride power transistor 110 may be formed of gallium nitride (GaN), and may be implemented as an insulated-gate FET (IGFET) or as a heterostructure FET (HFET), for example. In one implementation, III-nitride power transistor 110 may take the form of a metal-insulator-semiconductor FET (MISFET), such as a metal-oxide-semiconductor FET (MOSFET). Alternatively, when implemented as an HFET, III-nitride power transistor 110 may be a HEMT configured to produce a 2-DEG. According to one implementation, for example, III-nitride power transistor 110 may be a high voltage (HV) device configured to sustain a drain voltage of approximately 600V and having a gate rating of approximately 40V. It is noted that in some implementations, composite semiconductor device 100 may utilize an insulated gate bipolar transistor (IGBT) as a power device in place of a III-nitride FET or HEMT.

LV device 120 is shown to include LV transistor 140 and LV diode 130. In one implementation, LV diode may simply be a body diode of LV transistor 140, while in another implementation LV diode may be a discrete diode coupled to LV transistor 140 as shown in FIG. 1 to produce LV device 120. LV device 120 may be implemented as an LV group IV device, such as a silicon device having a breakdown voltage of approximately 25V, for example. According to one implementation, LV device 120 may be a silicon MISFET or MOSFET, for example, including LV body diode 130.

The cascoded combination of III-nitride power transistor 110 and LV device 120 produces composite semiconductor device 100, which according to the implementation shown in FIG. 1 results in a composite three terminal device functioning in effect as a FET having composite source 102 and composite gate 106 provided by LV device 120, and composite drain 104 provided by III-nitride power transistor 110. Moreover, and as will be described in greater detail below, composite semiconductor device 100 may be implemented as an HV composite device configured to have turn-on prevention control.

Figure 2:
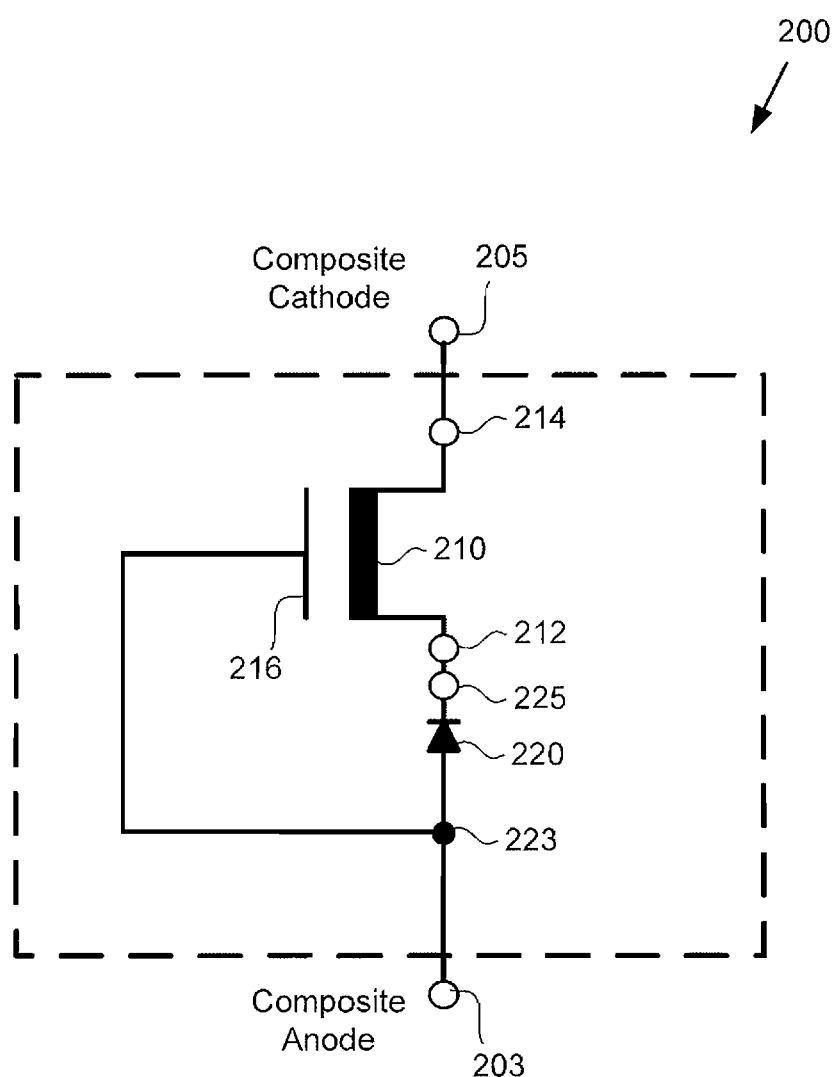
FIG. 2 presents a diagram showing another exemplary implementation of a composite semiconductor device.

Referring now to FIG. 2, FIG. 2 shows another exemplary implementation of a composite semiconductor device. As shown in FIG. 2, composite semiconductor device 200 includes III-nitride power transistor 210 (for example, a III-nitride field-effect transistor or a III-nitride high electron mobility transistor) and LV device 220 cascoded with III-nitride power transistor 210. III-nitride power transistor 210 is shown to include source 212, drain 214, and gate 216. III-nitride power transistor 210 corresponds to III-nitride power transistor 110, in FIG. 1, and may share any of the features previously attributed to III-nitride power transistor 110, above. Also shown in FIG. 2 are composite anode 203 and composite cathode 205 of composite semiconductor device 200.

According to the implementation shown by FIG. 2, LV device 220 is an LV diode including anode 223 and cathode 225, and may be implemented as an LV group IV diode such as a silicon diode, for example. LV device 220 is cascoded with III-nitride power transistor 210 to produce composite semiconductor device 200. That is to say, cathode 225 of LV device 220 is coupled to source 212 of III-nitride power transistor 210, anode 223 of LV device 220 provides composite anode 203 for composite semiconductor device 200, drain 214 of III-nitride power transistor 210 provides composite cathode 205 for composite semiconductor device 200, and gate 216 of III-nitride power transistor 210 is coupled to anode 223 of LV device 220.

The cascoded combination of III-nitride power transistor 210 and LV device 220 produces composite semiconductor device 200, which according to the implementation shown in FIG. 2 results in a composite two terminal device functioning in effect as a diode having composite anode 203 provided by LV device 220, and composite cathode 205 provided by III-nitride power transistor 210. Moreover, and as will be described in greater detail below, composite semiconductor device 200 may be implemented as an HV composite device configured to have turn-on prevention control.

Figure 3:
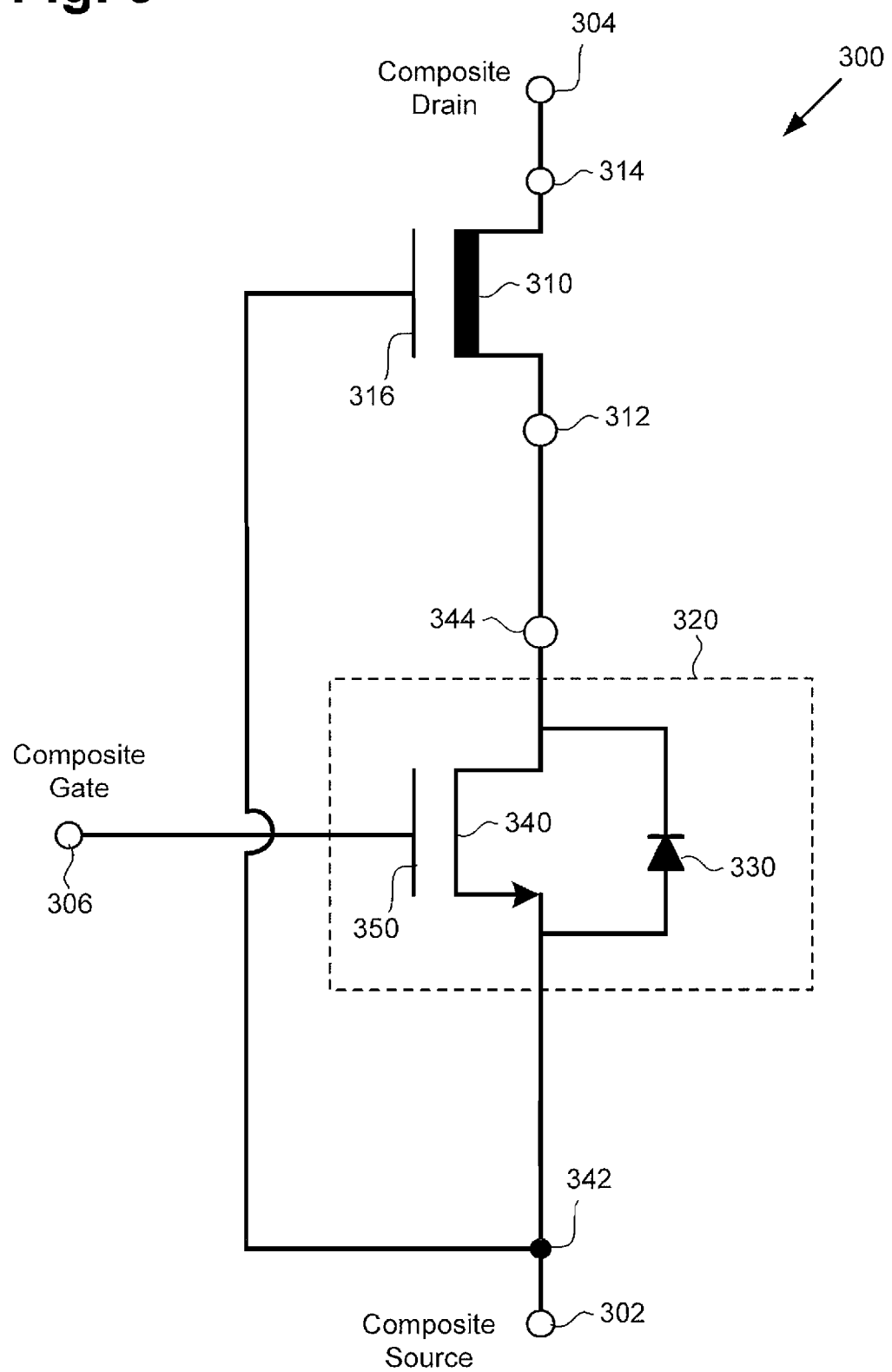
FIG. 3 shows a more detailed representation of a composite semiconductor device having turn-on prevention control, corresponding generally to the implementation shown by FIG. 1.

Continuing to FIG. 3, FIG. 3 shows a more detailed representation of a composite semiconductor device having turn-on prevention control, corresponding generally to the implementation shown by FIG. 1. Composite semiconductor device 300 includes III-nitride power transistor 310 (for example, a III-nitride field-effect transistor or a III-nitride high electron mobility transistor) and LV device 320 cascoded with III-nitride power transistor 310. As further shown in FIG. 3, LV device 320 includes LV transistor 340 and LV diode 330, which may be a body diode of LV transistor 340, for example. Also shown in FIG. 3 are composite source 302, composite drain 304, and composite gate 306 of composite semiconductor device 300, as well as source 312, drain 314, and gate 316 of III-nitride power transistor 310, and source 342, drain 344, and gate 350 of LV transistor 340.

Composite semiconductor device 300 having composite source 302, composite drain 304, composite gate 306, and formed from III-nitride power transistor 310 in combination with LV device 320 including LV transistor 340 and LV diode 330 corresponds to composite semiconductor device 100 having composite source 102, composite drain 104, composite gate 106, and formed from III-nitride power transistor 110 in combination with LV device 120 including LV transistor 140 and LV diode 130, in FIG. 1, and may share any of the characteristics previously attributed to those corresponding features, above.

As shown in FIG. 3, LV transistor 340 is cascoded with III-nitride power transistor 310 to produce composite semiconductor device 300. That is to say, drain 344 of LV transistor 340 is coupled to source 312 of III-nitride power transistor 310, source 342 of LV transistor provides composite source 302 for composite semiconductor device 300, and gate 350 of LV transistor 340 provides composite gate 306 for composite semiconductor device 300. Moreover, drain 314 of III-nitride power transistor 310 provides composite drain 304 for composite semiconductor device 300, while gate 316 of III-nitride power transistor 310 is coupled to source 342 of LV transistor 340.

The operation of composite semiconductor device 300 implemented as a normally OFF device formed from LV transistor 340 cascoded with normally ON III-nitride power transistor 310 will now be described by reference to specific, but merely exemplary, parameters. For example, as voltage is increased at composite drain 304 of composite semiconductor device 300 while III-nitride power transistor 310 is ON, a few volts (e.g., approximately 10V) will develop across reverse biased LV diode 330. This voltage is inverted and applied to gate 316 of III-nitride power transistor 310 (e.g., as an approximately −10V gate voltage). In response, III-nitride power transistor 310 will turn OFF (e.g., assuming a pinch voltage of approximately −7V) and any additional increase in the drain voltage at composite drain 304 will be sustained across drain 314 and source 312 of III-nitride power transistor 310. Consequently, LV transistor 340 and LV diode 330 will typically not be required to sustain a voltage beyond the first few volts (e.g., approximately 10V).

As previously noted above, in the absence of the turn-on prevention control disclosed herein, a composite semiconductor device such as composite semiconductor device 300 may be susceptible to being inadvertently turned ON, due to triggering of LV device 320 by noise spikes, for example. In implementations designed for noisy systems, such as noisy power management systems, for instance, the threshold voltage ($V_{th}$) of LV device 320 may be configured such that accidental turn-on due to system noise is substantially avoided. According to various implementations of the present disclosure, LV silicon device, such as LV transistor 340 for example, has a $V_{th}$ of approximately 1.8V. However, it may be advantageous in noisy system environments for the $V_{th}$ of LV transistor 340 to be set at approximately 3.0V to 4.0V, for example, or higher, so as to be noise resistant and provide turn-on prevention control for composite semiconductor device 300 by preventing noise current from flowing through the channel formed between source 312 and drain 314 of III-nitride power transistor 310 due to the presence of system noise. Moreover, in some applications, it may be desirable to set the $V_{th}$ of LV transistor 340 as high as approximately 7V, for example.

It is noted that although the present discussion focuses on the $V_{th}$ of LV transistor 340, that specific implementation is not to be interpreted as limiting. For example, one of ordinary skill in the art will recognize that the implementation shown by FIG. 3 can be suitably adapted such that LV device 320 takes the form of an LV diode, shown for example by LV diode 220, in FIG. 2. In such an alternative implementation, LV diode 220 can be configured to have a noise-resistant $V_{th}$ (i.e. a higher threshold voltage) to provide turn-on prevention control for composite semiconductor device 200 by preventing noise current from flowing through a channel formed between source 212 and drain 214 of III-nitride power transistor 210 in the noisy system.

Figure 4:
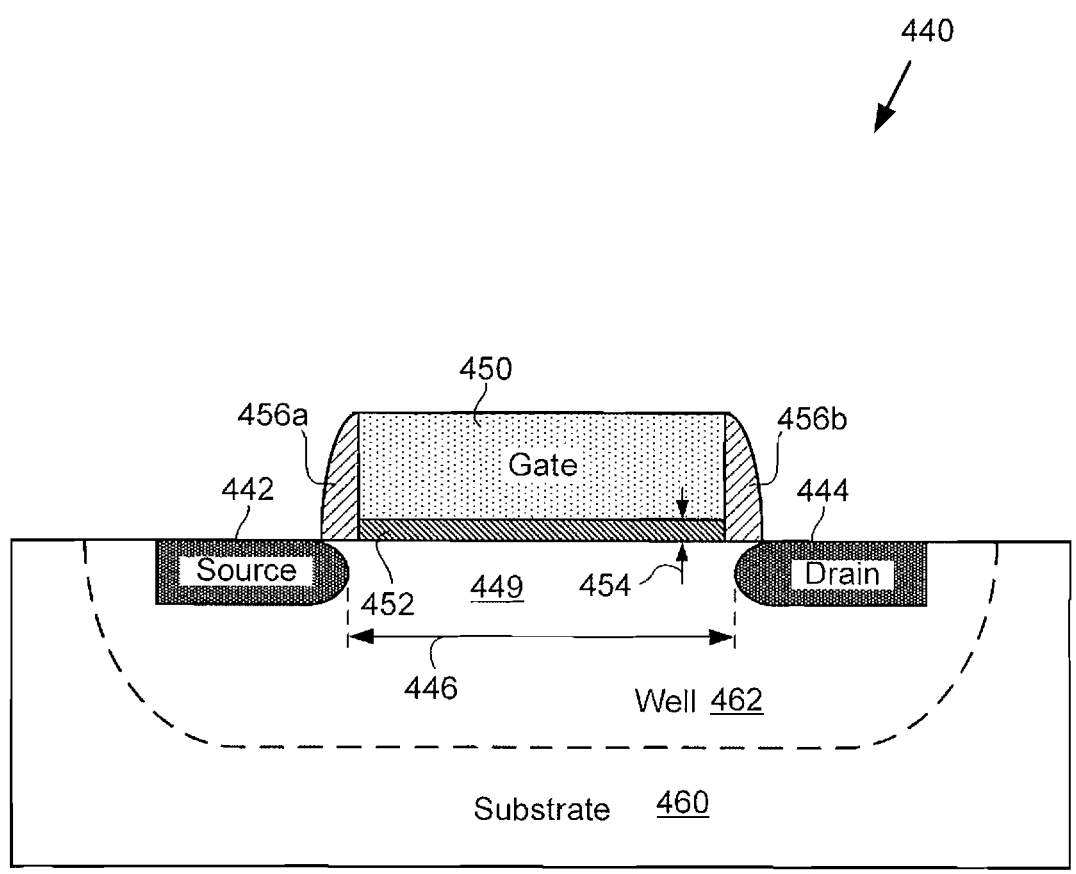
FIG. 4 shows a cross-sectional view of one implementation of a low voltage (LV) transistor suitable for use in a composite semiconductor device and configured to provide turn-on prevention control.

Returning to the implementation shown by FIG. 3, and referring now as well to FIG. 4, FIG. 4 shows a cross-sectional view of one implementation of LV transistor 440 suitable for use in a composite semiconductor device and configured to have a noise resistant threshold voltage to provide turn-on prevention control. As shown in FIG. 4, LV transistor 440 is situated in well 462 formed in substrate 460, and includes source 442, drain 444, and gate 450. As further shown in FIG. 4, LV transistor 440 also includes gate dielectric 452 having thickness 454, spacers 456a and 456b, and channel region 446 including body implant 449. LV transistor 440 including source 442, drain 444, and gate 450 corresponds to LV transistor 340 including source 342, drain 344, and gate 350, in FIG. 3.

According to the implementation shown in FIG. 4, LV transistor 440 is represented as a FET. When implemented as such, LV transistor 440 may be fabricated as an n-channel device (NFET) or p-channel device (PFET). Although for the purposes of the present discussion LV device 440 will be described as an NFET, that example characterization is not to be interpreted as a limitation.

When LV transistor 440 is implemented as an NFET, well 462 may be a P type well formed in substrate 460, which may include an epitaxial region formed on a silicon substrate, for example (epitaxial region not distinguished as such in FIG. 4). Moreover, in such an implementation, source 442 and drain 444 may be heavily doped N+ regions, while body region 446 may include a P type body implant 449, such as a boron implant, for example. Gate 450 may be formed of a suitable gate metal, or of a doped polysilicon, for example, while gate dielectric 452 may be formed of a gate oxide, such as silicon oxide ($SiO_2$) or, alternatively, a low-k dielectric in various implementations to achieve a higher threshold voltage device, as discussed further below. Spacers 456a and 456b can be $Si_3N_4$ spacers, for example, and can be formed using any suitable technique, as known in the art.

As discussed above, it may be advantageous to produce LV transistor 440 having a noise-resistant $V_{th}$ (i.e. a higher threshold voltage) to provide turn-on prevention control for a composite semiconductor device including LV transistor 440 in order to prevent noise current from flowing through a channel of a III-nitride power transistor of the composite semiconductor device. Such a noise-resistant $V_{th}$ may be achieved, for example, by increasing gate dielectric thickness 454 either in effect, or in fact. An increase in fact of gate dielectric thickness 454 may be accomplished by fabricating LV transistor 440 to have increased gate dielectric thickness 454. Alternatively, an increase in effect of gate dielectric thickness 454 may be accomplished by fabricating LV transistor 440 to include a low-k gate dielectric 452, such as, by way of examples and without limitation, porous silica, fluorinated amorphous carbon, aromatic hydrocarbon, carbon-doped oxide, parylene, polyarylene ether, silsesquioxane, fluorinated silicon dioxide, and diamondlike carbon.

Alternatively, or in addition to increasing gate dielectric thickness 454, a noise resistant $V_{th}$ can be produced or the threshold voltage further increased by fabricating LV transistor 440 so as to have an appropriate body implant concentration and profile for enhancing noise resistance. For example, in the described exemplary NFET implementation, the energy and dosage of the boron implant used to produce body implant 449 can be optimized to increase $V_{th}$.

It may also be advantageous to minimize semiconductor package parasitics, such as semiconductor package inductances of the composite semiconductor device. Referring again to composite semiconductor device 300, in FIG. 3, for example, in one implementation, III-nitride power transistor 310 and LV device 320 may be monolithically integrated, as disclosed in U.S. patent application Ser. No. 12/455,117, entitled "Monolithic Vertically Integrated Composite Group III-V and Group IV Semiconductor Device and Method for Fabricating Same", filed on May 28, 2009 and issued as U.S. Pat. No. 7,915,645 on Mar. 29, 2011; as well as by U.S. patent application Ser. No. 12/653,240, entitled "Highly Conductive Source/Drain Contacts in III-Nitride Transistors", filed on Dec. 10, 2009; U.S. patent application Ser. No. 12/928,103, entitled "Monolithic Integration of Silicon and Group III-V Devices", filed on Dec. 3, 2010; and U.S. patent application Ser. No. 13/020,243 entitled "Efficient High Voltage Switching Circuits and Monolithic Integration of Same", filed on Feb. 3, 2011, each of which is hereby incorporated by reference in its entirety.

Thus, by utilizing an LV device having a noise-resistant threshold voltage, the present application discloses a solution for providing turn-on prevention control for a composite semiconductor device formed from a cascoded combination of the LV device and a III-nitride power transistor, by preventing noise current from flowing through a channel of the III-nitride power transistor. As a result, an LV group IV device can be advantageously cascoded with a normally ON III-nitride power transistor to produce a rugged, normally OFF HV composite device displaying high durability and reliable operation in noisy system environments.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A normally OFF composite semiconductor device for use in a noisy system, said normally OFF composite semiconductor device including a turn-on prevention control, said normally OFF composite semiconductor device comprising:
 a normally ON III-nitride power transistor;
 a low voltage (LV) group IV device cascoded with said normally ON III-nitride power transistor to form said normally OFF composite semiconductor device, said LV group IV device configured to hold said normally ON III-nitride power transistor OFF when said normally OFF composite semiconductor device is OFF;
 said LV group IV device having a low-k gate dielectric with a thickness configured to provide said LV group IV device with a noise-resistant threshold voltage of greater than 1.8V to provide said turn-on prevention control for said normally OFF composite semiconductor device by preventing noise current from flowing through a channel of said normally ON III-nitride power transistor in said noisy system.

2. The normally OFF composite semiconductor device of claim 1, wherein said normally ON III-nitride power transistor comprises a III-nitride field-effect transistor (III-N FET).

3. The normally OFF composite semiconductor device of claim 1, wherein said normally ON III-nitride power transistor comprises a III-nitride high electron mobility transistor (III-N HEMT).

4. The normally OFF composite semiconductor device of claim 1, wherein said LV group IV device comprises a silicon device.

5. The normally OFF composite semiconductor device of claim 1, wherein said LV group IV device comprises an LV group IV field-effect transistor (LV FET).

6. The normally OFF composite semiconductor device of claim 1, wherein said LV group IV device is one of an LV metal-oxide-semiconductor FET (LV MOSFET) and an LV metal-insulator-semiconductor FET (LV MISFET).

7. The normally OFF composite semiconductor device of claim 1, wherein said normally ON III-nitride power transistor and said LV group IV device are monolithically integrated.

8. A composite semiconductor device including a turn-on prevention control for use in a noisy system, said composite semiconductor device comprising:
 a III-nitride power transistor;
 a low voltage (LV) group IV transistor;
 a drain of said LV group IV transistor coupled to a source of said III-nitride power transistor, a source of said LV group IV transistor providing a composite source for said composite semiconductor device, and a gate of said LV group IV transistor providing a composite gate for said composite semiconductor device, a drain of said III-nitride power transistor providing a composite drain for said composite semiconductor device, a gate of said III-nitride power transistor being coupled to said source of said LV group IV transistor, said LV group IV transistor configured to hold said III-nitride power transistor OFF when said composite semiconductor device is OFF;
 said LV group IV transistor having a low-k gate dielectric with a thickness configured to provide said LV group IV device with a noise-resistant threshold voltage of greater than 1.8V to provide said turn-on prevention control for said composite semiconductor device by preventing noise current from flowing through a channel of said III-nitride power transistor in said noisy system.

9. The composite semiconductor device of claim 8, wherein said III-nitride power transistor comprises a III-nitride field-effect transistor (III-N FET).

10. The composite semiconductor device of claim 8, wherein said III-nitride power transistor comprises a III-nitride high electron mobility transistor (III-N HEMT).

11. The composite semiconductor device of claim 8, wherein said LV group IV transistor comprises an LV silicon transistor.

12. The composite semiconductor device of claim 8, wherein said LV group IV transistor is one of an LV metal-oxide-semiconductor FET (LV MOSFET) and an LV metal-insulator-semiconductor FET (LV MISFET).

13. The composite semiconductor device of claim 8, wherein said III-nitride power transistor and said LV group IV transistor are monolithically integrated.

* * * * *